United States Patent [19]

Stasicki et al.

[11] Patent Number: 5,808,497
[45] Date of Patent: Sep. 15, 1998

[54] DIGITAL PHASE SHIFTER

[76] Inventors: Boleslaw Stasicki, Leinestr. 32, D - 37124 Rosdorf; Gerd E. A. Meier, Am Menzelberg 6, D - 37077 Göttingen, both of Germany

[21] Appl. No.: 757,993

[22] Filed: Nov. 27, 1996

[30] Foreign Application Priority Data

Nov. 30, 1995 [DE] Germany .................. 195 44 642.9

[51] Int. Cl.$^6$ .................................. H03K 17/22
[52] U.S. Cl. .................. 327/233; 327/236; 327/241; 327/248; 327/250
[58] Field of Search .................. 327/231, 233, 327/236, 241, 248, 250

[56] References Cited

U.S. PATENT DOCUMENTS 5,015,872  5/1991  Rein ............................ 327/237

5,294,841  3/1994  Magarshack ...................... 327/237

*Primary Examiner*—Margaret Rose Wambach
*Attorney, Agent, or Firm*—Thomas, Kayden, Horstemeyer & Risley

[57] ABSTRACT

The present invention provides a method of and an apparatus for producing an output signal which is, relative to a periodic input signal, delayed by a predetermined phase angle phi. Initially, the phase angle phi between 0 and $2\pi$ is divided by $2\pi$ and multiplied by a predetermined positive integer number Z, whereby an integer phase number F between 0 and Z in obtained after rounding. Then, timing-pulse are, beginning with zero, counted between a first and a second input pulse, and an integer relative phase number P is obtained from the number N of the timing-pulses by multiplying by the phase number F, dividing by Z and rounding. Following the second input signal, the timing pulses are, beginning with zero, counted until the relative phase number P in reached. At last, an output pulse is emitted upon reaching the relative phase number P.

10 Claims, 2 Drawing Sheets

DIGITAL PHASE SHIFTER

TECHNICAL FIELD

The invention relates to a method of producing an output signal which, relative to a periodic input signal, is delayed by a predetermined phase angle phi, and to an apparatus for carrying out such a method. In the following, by the term phase shifter it is referred to both the method and the apparatus.

BACKGROUND OF THE INVENTION

Known phase shifters can be divided up in three groups:

phase shifters for analog signals, for example sinusoidal signals, the phase shift being performed by means of RC or RL elements;

phase shifters for pulse-shaped signals, the phase shift being performed by means of time-delay elements; and phase shifters having a so-called Phase Locked Loop (PLL).

The phase shifters of the first two groups show a strong dependency of the phase angle on the frequency of the input signal. If the phase angle by which the output signal is shifted relative to the input signal is constant, the frequency of the input signal has to be kept constant as well.

PLL circuits need a transient time of several periods to adapt to the input signal and work in a narrowly restricted range of frequency only.

PROBLEM OF THE INVENTION

It is the problem of the invention to provide a phase shifter for pulse-shaped signals, in which the phase angle by which the output signal is delayed relative to the input signal can be selected between 0 and $2\pi$, i.e. a full phase angle, and in which the phase angle remains constant with changes in the frequency of the input signal. At the same time, the phase shifter shall work over a wide range of frequencies of the input signal and have a as short as possible response time upon changes in the frequency of the input signal.

SUMMARY OF THE INVENTION

This problem is solved by a method comprising the steps of starting with an integer phase number F between 0 (zero) and a positive integer number Z, the phase number F being the divided by $2\pi$, multiplied by the number Z and afterwards rounded down phase angle phi; converting the phase number F into an integer relative phase number P by counting, beginning with 0 (zero), timing-pulses between a first and a second input pulse and by rounding the number N of the timing-pulses multiplied by the phase number F and divided by the number Z; counting, beginning with 0 (zero) after the second input pulse, the timing-pulses until the relative phase number P is reached; and emitting an output pulse upon reaching the relative phase number P.

Further, the problem is solved by an apparatus comprising a timing-pulse generator which generates timing-pulses at equal intervals; a phase input circuit which generates an integer phase number F between 0 (zero) and a positive integer number Z, the phase number F being the divided by $2\pi$, multiplied by the number Z and afterwards rounded down phase angle phi; a phase adapting circuit generating an integer relative phase number P from the phase number F, the phase adapting circuit counting, beginning with 0 (zero), the timing-pulses between a first and a second input pulse, and rounding the number N of the timing-pulses multiplied by the phase number F and divided by the number Z; and an output trigger circuit, which counts, beginning with 0 (zero) after the second input pulse, the timing-pulses until the relative phase number P is reached and generates an output pulse upon reaching the relative phase number P.

DESCRIPTION OF THE INVENTION

The phase shifter according to the invention works according to the following principle: Two succeeding input pulses define the length of the period of the input signal. Within each period, internal timing-pulses are counted which have a constant frequency much higher than the input signal, for example 25 MHz. The number N of the timing-pulses counted within one period of the input signal is multiplied by a predetermined integer phase number F which is proportional to the desired phase angle phi. F has a value between 0 (zero) and Z, $2\pi/Z$ being the angle resolution of the phase shifter.

In the preferred embodiment of the phase shifter, z is $2^b$, b being the width (bit number) of the essential electronic elements of the phase shifter. The product of the number N and the phase number F is divided by Z. However, an inverse sequence of the multiplication and the division is also possible. In any case, the rounded result is an integer relative phase number $P=N*F/Z$. After the second input pulse, an output pulse is emitted upon the P-th timing-pulse. The phase of said output pulse is shifted by the phase angle phi relative to the second input pulse. The response time of the phase shifter is one period of the input signal.

If, for example, $Z=2^8$, i. e. b=8, then the phase number F can have a value from 0 (zero) up to 255. The phase angle phi can be recursively determined from the phase number F according to phi=(F/256) * $2\pi$. The angle resolution of the phase shifter is $2\pi/256$, i.e. the full angle of $2\pi$ is divided up into 256 parts.

Preferably, the phase shifter is edge-controlled on the input side; in this regard, standardized digital signals, for example TTL signals, can be used. The position of the active edge of the output pulse relative to the active edge of the input pulse is regarded as the phase angle.

One possible application of the new phase shifter is its integration into stroboscopes. The phase shifter according to the invention is, for example, best suited for integration into a video stroboscope known from published German Patent Application 43 09 353 to replace the timing element for the trigger signal which is mentioned there.

In the case of stroboscopes, which are used for the observation of periodically occurring processes and which do not work with a fixed frequency, trigger pulses for the light source of the stroboscope are derived from the process with the aid of a suitable sensor. If the process is to be observed under a phase angle determined by the user, then a timing element or a phase shifter for the trigger pulses is to be connected upstream of the light source. In using the new phase shifter it is possible to observe the processes under a phase angle freely defined by the user. This phase angle remains constant during a change in the frequency of the process. A slow motion effect results from a continuous change in the phase angle. In using the new phase shifter, the frequency of the imaginary slow motion picture is only dependent on the velocity of the change in the phase angle which was previously determined by the user, but not on the frequency of the process or a change in this frequency. Thus, the process can be selectively observed both under a predetermined phase angle and under a predetermined phase angle velocity. The phase angle velocity remains constant, even if the frequency of the process drastically changed.

Additionally, the slow motion function of the new phase shifter can be modified by a specific instruction for the change in the phase angle, so that only one or more selected phase angle ranges are scanned with a pre-defined velocity. Thereby, it is possible to observe the process in slow motion only in those phase angle ranges in which events interesting to the observer occur. If, for example, a movement of the contacts of a periodically triggered relay is to be investigated, then the closing (and eventually the opening) of the contacts can be observed in slow motion, without having to view the contacts during the relatively long intervals of non-movement.

Hereinafter, the phase shifter according to the invention will be explained and described in more detail by means of an embodiment example.

DETAILED DESCRIPTION OF THE DRAWINGS

Figure 1:
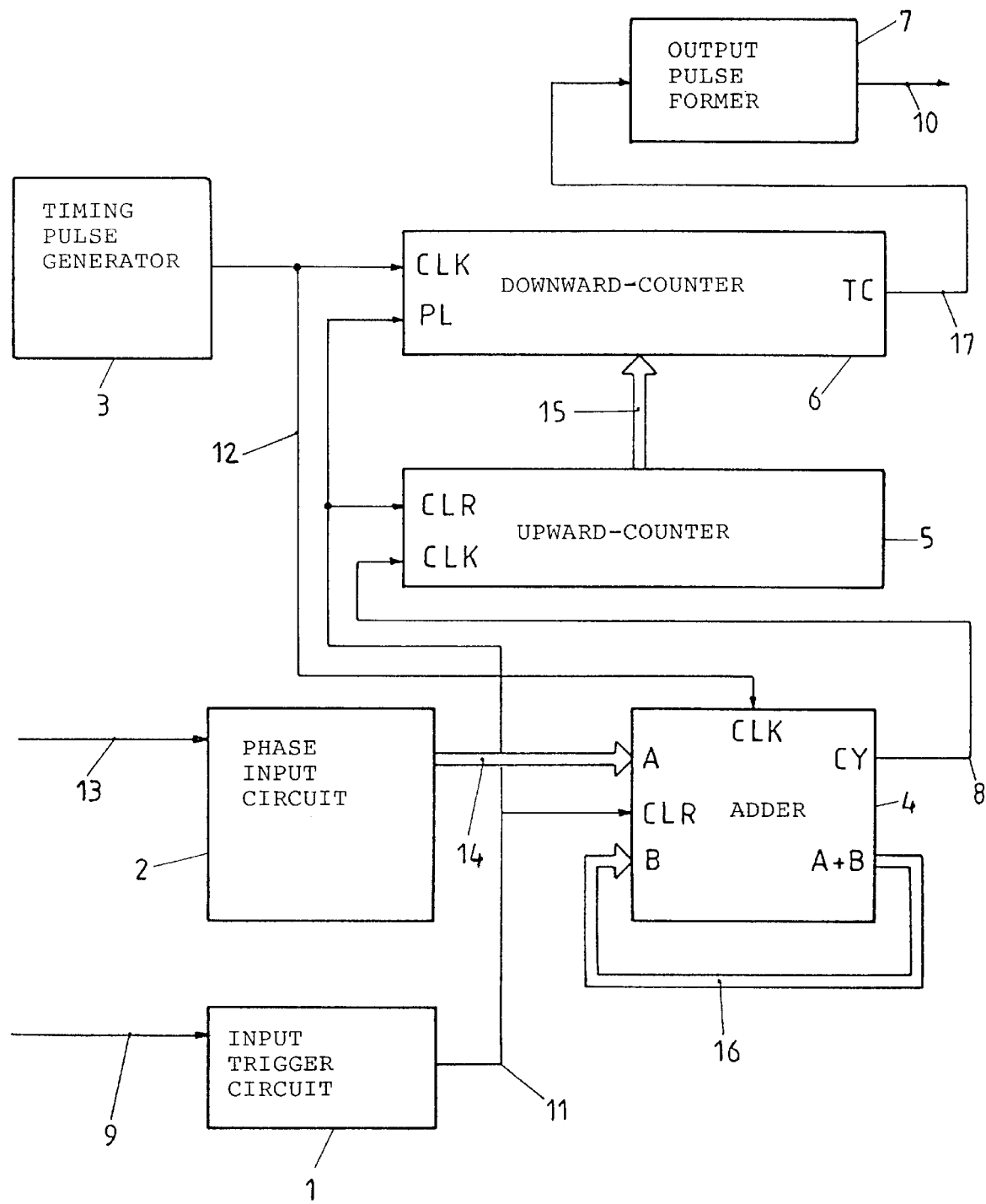
FIG. 1 is a block diagram of the phase shifter.

The phase shifter according to FIG. 1 consists of digital circuit components 1 to 7 which are known in the art. These are an input trigger circuit 1, a phase input circuit 2, a timing-pulse generator 3, a digital adder 4, a upward-counter 5, a downward-counter 6 and an output pulse former 7.

With the input trigger circuit 1 it is defined when an input pulse 11 is present. As a rule, this is performed using a leading or trailing edge of the input signal. With this edge, the input trigger circuit 1 is triggered to generate a standardized input pulse 11, the leading edge of which coincides with the active edge of the input signal. (The internal response delay of the input trigger circuit is neglected, here.) If necessary, the input trigger circuit 1 can be provided on the input side with a Schmitt-Triggerfor regeneration of the input signal or with an analog voltage comparator by which non-standarized input signals are converted into standardized signals, for example TTL. The input trigger circuit I is an interface of the phase shifter to the environment; however, it has no special importance for the relevant function of the phase shifter.

The phase input circuit 2 serves to convert the desired phase angle 13 having a value of phi, which is to be realized by the phase shifter, into an integer phase number 14 having a value of F. The input of the phase angle phi 13 can be effected by hand (for example with a keyboard or with an angle decoder), or by a computer via a suitable interface or by any other microprocessor controlled circuit. The phase number F is provided by the phase input circuit 2 in binary form. Thus, the full phase angle of $2\pi$ is divided up into 256 parts in a phase input circuit of 8 bits width. Accordingly, the angle resolution (i.e. the smallest phase angle) is $2\pi/256$. With each additional bit the resolution of the phase input circuit is doubled. The width of the phase input circuit 2 is preferably the same as the width of the adder 4.

The timing pulse generator 3 can be a quartz oscillator circuit. The frequency of the timing-pulses supplied by the timing-pulse generator 3 is generally not critical. However, the frequency of the timing-pulses is to be suited to the order of the working frequencies of the phase shifter taking into consideration the angle resolution. The maximum working frequency of the phase shifter, i.e. the frequency in which the full phase resolution is barely realized, is dependent on the frequency of the timing-pulses. However, the minimum working frequency of the phase shifter is also dependent on the frequency of the timing-pulses. If the frequency of the timing-pulses is increased, then this lower limit of the working frequency range of the phase shifter is also increased. This effect can be precluded to a certain extent by a large-scale dimensioning of the upward-counter 5 and the downward-counter 6. In experiments, a frequency of the timing-pulses of about 25 MHz proved to be worthwhile.

The digital binary adder 4 has a resetting input CLR, a timing-pulse input CLK, two parallel data inputs A and B, a parallel data output A+B and an overflow output CY. The input CLR of the adder 4 is connected with the output of the input trigger circuit 1. The timing-pulse input CLK of the adder 4 is connected with the output of the timing-pulse generator 3. The parallel data input A of the adder 4 is connected with the parallel output of the phase input circuit 2. The width (bit number) b of the parallel data input A of the adder 4 is preferably equal to the width of the output of the phase input circuit 2. The parallel data input B is a feed-back of the parallel data output A+B of the adder 4. The adder 4 is reset by each input pulse 11 coming from the input trigger circuit 1 and present at the input CLR of the adder 4. Afterwards, the binary phase number F present at the data input A is repeatedly added to the previous sum Si−1=A+B upon every timing-pulse. The overflow pulses 8 are supplied from the overflow output CY to the upward-counter 5.

The binary upward-counter 5 has a timing-pulse input CLK and a resetting input CLR. The timing-pulse input CLK is connected with the overflow output CY of the adder 4. Upon every overflow pulse the count of the upward-counter 5 is increased by 1 (one). The input CLR of the upward-counter 5 is connected with the output of the input trigger circuit 1. Every input pulse 11 resets the count of the upward-counter to 0 (zero). The upward-counter 5 has a parallel data output with a width (bit number) equal to its number of counter steps. The minimum working frequency in which a correct function of the phase shifter is ensured is dependent on the number of counter steps of the upward-counter 5. The more counter steps the upward-counter 5 comprises, the lower is the lower limit of the working frequency range. With a fixed frequency of the timing pulses, the maximum number of the counter steps of the upward-counter 5 is limited by the velocity of the electronic components used.

The binary downward-counter 6 has the same number of counter steps as the upward-counter 5. The downward-counter 6 has a timing-pulse input CLK, a load command input PL and a parallel data input the width (bit number) of which corresponds to the counter steps of the downward-counter 6. The timing-pulse input CLK of the downward-counter 6 is connected with the output of the timing-pulse generator 3. The load command input PL of the downward-counter 6 is connected with the output of the input trigger circuit 1. The parallel data input is connected with the parallel data output of the upward-counter 5. Upon every input pulse 11, the binary number which is currently present at the data input and which is the relative phase number 15 having a value of P is loaded in the downward-counter 6. Upon every timing-pulse, the count of the downward-counter is decreased by 1 (one). When the downward-counter reaches the count 0 (zero), a zero pulse 17 is put out at its output TC.

The digital adder 4 and the upward-counter 5 connected downstream together form a phase adapting circuit 4, 5 which has a multiplication function and a division function. The number N of the timing-pulses 12 which are counted between two adjoining input pulses 11 is multiplied by the phase number F which corresponds to the desired phase angle phi. The multiplication N*F is realized by a N-fold addition of the number F. The product N*F is represented by a binary number in which the LSB (least significant bits) are present as a subsum 16 at the data output A+B of the adder 4 and in which the MSB (most significant bits) are present at the parallel output of the upward-counter 5. Only the MSB of the product N*F are loaded in the downward-counter 6, which corresponds to a division of the product N*F by $Z=2^b$ and a rounding down or the result to an integer number. Thus, the integer relative phase number P is obtained.

The output pulse former 7 has an input and an output. The input of the output pulse former 7 is connected with the output TC of the downward-counter 6. The output of the output pulse former 7 is the output for the output signal 10 of the total phase shifter. Upon every zero pulse 17, an output pulse 18 is put out at the output of the output pulse former; the width and the active edge (leading or trailing) of the output pulse 18 may be suited to the implement connected downstream of the phase shifter. The output pulse former 7 is an interface of the phase shifter to the environment and is, like the input trigger circuit, of no essential relevance for the substantial function of the phase shifter.

The parameters of the phase shifter can be easily suited to different applications. For example, the phase input circuit 2 and the adder 4 can have a width of eight bits, i.e. the full phase angle $2\pi$ is divided up into 256 parts. In this case, the angle resolution, i.e. the minimum phase angle phi, is $2\pi/256$. With a phase input circuit 2 and an adder 4 both having a width of nine bits, the full phase angle of $2\pi$ is divided up into 512 parts, and the angle resolution is $2\pi/512$. With a phase input circuit 2 and a adder 4 both having a width of 16 bits, the full phase angle of $2\pi$ is divided up into 65,536 parts and the angle resolution is $2\pi/65,536$. However, the maximum working frequency of the phase shifter decreases, if the frequency of the timing-pulses is kept constant. For example, with a width of the phase input circuit 2 and of the adder 4 of 8 bits and with a frequency of the timing pulses of 25 MHZ, the maximum working frequency of the phase shifter is 25,000,000 Hz/256=97.656 kHz. By increasing the width of the phase input circuit 2 and of the adder 4 to 9 bits, the maximum working frequency of the phase shifter is decreased to 25,000,000 Hz/512=48.828 kHz, if the frequency of the timing-pulses remains constant at 25 MHz. By increasing the width of the phase input circuit 2 and of the adder 4 to 16 bits, the maximum working frequency of the phase shifter is decreased to 25,000,000 Hz/65,536=381 Hz, if the frequency of the timing-pulses remains constant at 25 MHz.

With upward-counters 5 and downward-counters 6 having a length of 24 steps and with a frequency of the timing pulses of 25 MHz, the minimum working frequency is 25,000,000 Hz/$2^{24}$=1,49 Hz. With upward-counters 5 and downward-counters 6 having a length of 32 steps and with a frequency of the timing pulses of 25 MHz, the minimum working frequency is 25,000,000 Hz/$2^{32}$=0,0058 Hz.

As an option, other angle resolutions corresponding to $2\pi/2^b$ can be realized with the phase shifter. To this end, the adder 4 is to be formed in such a way that its overflow pulses 8 are generated upon reaching other values at the output A+B than $2^b$. Thus, an adder having a width of 9 bits can be modified, for example, in such a way that it puts out its overflow pulses at the overflow output CY each time the value Z=360 is reached at the output A+B. In this case, the angle resolution of the phase shifter is $2\pi/360$, i.e. exactly 1°, and the maximum working frequency of the phase shifter is 25,000,000 Hz/360=69.444 kHz. Phase shifter variants dimensioned in this way are realizable in practice with usual digital technique components.

The cooperation of the components 1 to 7 in the operation of the phase shifter is explained in more detail hereinafter. The input signal 9 is supplied to the input of the input trigger circuit 1. The input trigger circuit 1 obtains standardized input pulses 11 from the input signal 9. These input pulses 11 reset the adder 4 as well as the upward-counter connected downstream of the adder 4 and, at the same time, initiate the loading operation of the downward-counter 6. Within the adder 4 and the upward-counter 5 connected downstream of the adder 4, the number N of the timing-pulses occurring between two adjoining input pulses 11 is first multiplied by the phase number 14 and then divided by the number $Z=2^b$ resulting from the width b of the phase input circuit 2 and of the adder 4 (for example 256 with a width of 8 bits). The phase number 14 has a value of F which is generated by the phase input circuit 2 and which corresponds to the desired phase angle phi. Upon every succeeding input pulse 11, the rounded down result, i.e. the integer relative phase number $P=N*F/2^b$, which is then present at the parallel data output of the upward-counter 5, is loaded into the downward-counter 6. With the same input pulse 11, the adder 4 and the upward-counter 5 are reset to repeat their counting and calculating operation during the new period of the input signal. At the same time, the downward-counter 6 counts the timing-pulses downwards beginning with the just loaded relative phase number $P=N*F/2^b$. When the count reaches the value of 0 (zero), the downward-counterputs out a zero pulse 17 at its output TC. When the ratio of the loaded relative phase number $P=N*F/2^b$ to the total number N of the timing pulses which occur within one period of the input signal 9 is equal to the ratio of the phase number F generated with the phase input circuit 2 to the number $Z=2^b$ resulting from the width b of the components 2 and 4, the zero pulse 17 has the desired phase position relative to the respective input pulse. I.e. the zero pulse 17 has a delay by the phase angle phi. The phase position of the output pulse 18 of the output pulse former 7 is the same as the phase position of the zero pulse of the downward-counter 6, when the output pulse former 7 is connected directly downward of the downward-counter 6 and when its internal delay can be neglected. In the allowable working range of the phase shifter, the phase angle phi is independent of the frequency of the input signal 9.

If the phase number F which is generated with the phase input circuit 2 and which corresponds to the desired phase angle phi is continuously changed, then the phase shifter in conjunction with a stroboscope can be used to achieve a slow motion effect. The velocity, with which the process observed under slow motion imaginarily occurs, only depends on the velocity with which the desired phase angle is changed and does not depend on the actual velocity (frequency) of the observed process. Thus, a rotating wheel having a rotating frequency which varies can be stroboscopically observed. With a width of the phase input circuit 2 of 8 bits, the phase number F can be continuously increased from 0 up to 255 within 10 seconds to achieve a slow motion effect. By means of the binary representation of the phase number F restricted to 8 bits it is ensured that the phase number F, after a value of 255, returns to a value of 0 (zero) and that the process is repeated periodically, i.e. without cracks. In this way, a full rotation of the wheel is observed within each 10 seconds. At this point, it is to be pointed out again that the imaginary velocity of the wheel is independent of the real velocity of the wheel and its changes in using the new phase shifter.

If an event interesting to the observer only takes place in a certain phase range, the slow motion can be restricted to only scan this range. As an example, the backlash of a valve spring of a combustion engine shall be examined at different revolutions per minute. The backlash may take place in the phase range between $\pi/2$ and $\pi$. The width of the phase input circuit 2 may be 8 bits. To restrict a slow motion examination to the desired phase range, the phase number F which is generated with the phase input circuit 2 and which corresponds to the desired phase angle phi is continuously increased from a value of 64 up to a value of 128. After the value of 128, the phase input circuit 2 jumps back to the value of 64. This value is again continuously increased up to a value of 128, and so on. By means of this measure, only the interesting backlash process of the spring is stroboscopically investigated and no time is spent scanning the phase range from $\pi \ldots 2\pi \ldots \pi/2$ in which no backlash of the spring occurs. It is also possible to scan several phase ranges of any size, in any order, in any direction and with any velocity. Such relatively complicated operations of the phase shifter scan be effected by a computer or a special microprocessor circuitry which can be connected to or integrated in the phase input circuit 2 via software.

Figure 2:
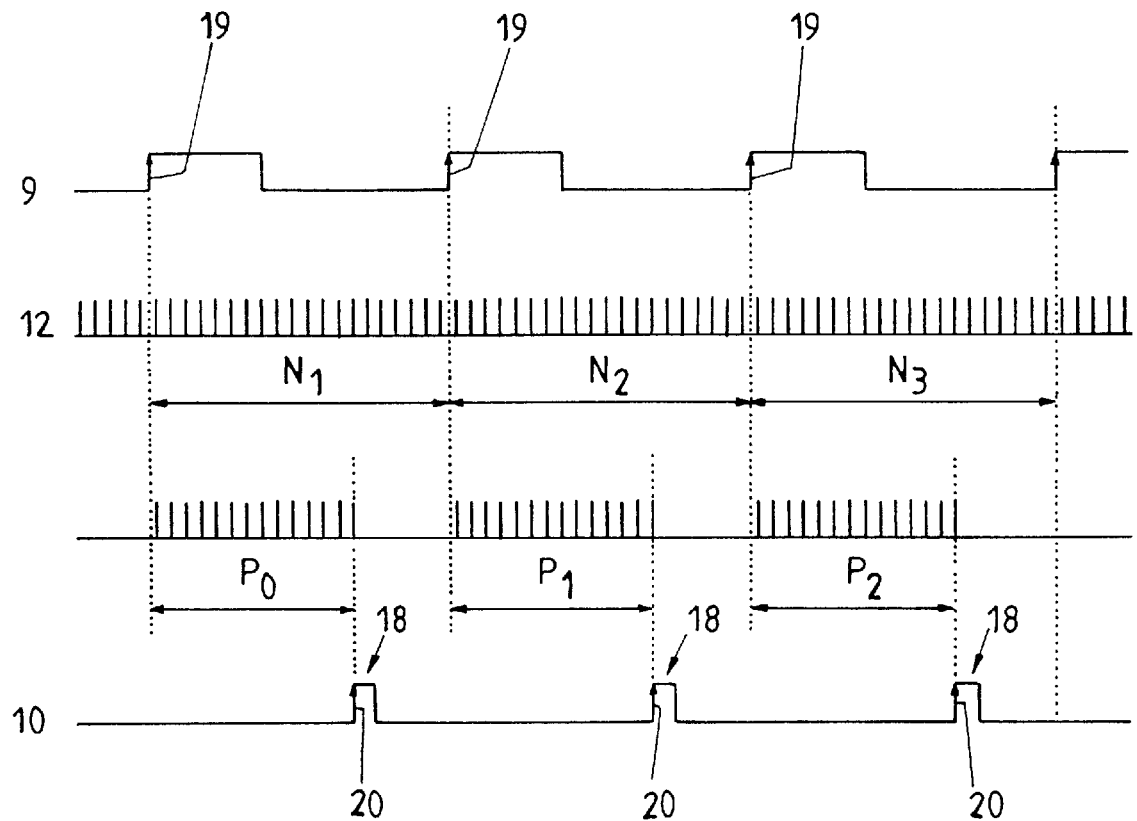
FIG. 2 is a timing diagram of the function of the phase shifter according to FIG. 1.

The timing diagram depicted in FIG. 2 shows the input signal 9 having leading edges 19 which trigger the emission of standardized input pulses by the input trigger circuit 1. Below the input signal, the timing-pulses 12 are shown which are counted during each period j of the input signal 9 and which number is $N_j$. Further below, the timing pulses are represented which are subtracted from the previously determined relative phase number $P_{j-1}$, at the beginning or the period j of the input signal 9 until the count of 0 (zero) is reached in the downward-counter 6. FIG. 2 further shows the output signal 10 in which the leading edges 20 or the output pulses are delayed relative to the leading edges 19 of the input signal 9 by the desired phase angle phi.

LIST OF REFERENCE NUMERALS

1—input trigger circuit
2—phase input circuit
3—timing-pulse generator
4—adder
5—upward-counter
6—downward-counter
7—output pulse former
8—over-flow pulse
9—input signal
10—output signal
11—input pulse
12—timing-pulse
13—phase angle
14—phase number
15—relative phase number
16—subsum
17—zero-pulse
18—output pulse
19—edge
20—edge
4,5—phase adapting circuit
6,7—output trigger circuit

We claim:

1. A method of producing an output signal which, relative to a periodic input signal, is delayed by a predetermined phase angle phi, the method comprising the steps of:

deriving an integer phase number F between 0 (zero) and a predetermined integer number Z from the phase angle phi by rounding the phase angle phi after dividing the phase angle phi by $2\pi$ and after multiplying the angle phi by the integer number Z;

converting the integer phase number F into an integer relative phase number P by counting a number N of timing-pulses that occur between an occurrence of a first input pulse and an occurrence of a second input pulse and by rounding the number N of the timing-pulses after multiplying the number N by the phase number F and after dividing the number N by the integer number Z;

counting, after the occurrence of the second input pulse, a second number of timing-pulses;

comparing the number N to the second number; and emitting an output pulse when the number N corresponds with the second number.

2. The method according to claim 1, wherein the converting step further includes the step of adding the phase number F to a previous sum $S_{i-1}$ upon every occurrence of the timing-pulses that occur between the occurrence of the first input pulse and the occurrence of the second input pulse.

3. The method according to claim 2, wherein the converting step further includes the steps of:

subtracting Z from a sum $S_i$ when the sum $S_i$ corresponds to the integer number Z; and counting how often the sum $S_i$ corresponds to the integer number Z.

4. The method according to claim 3, wherein the converting step further includes the step of counting how often an over-flow of a predetermined number of digits occurs, wherein the integer number Z corresponds to the sum $S_i$ when the over-flow of the predetermined number of digits occurs.

5. The method according to claim 1, wherein the counting step further includes the steps of:

counting down beginning with the relative phase number P; and emitting an output pulse upon reaching 0 (zero).

6. An apparatus for producing an output signal which, relative to a periodic input signal, is delayed by a predetermined phase angle phi, the apparatus comprising:

a timing-pulse generator configured to generate timing-pulses at equal intervals;

a phase input circuit configured to generate an integer phase number F between 0 (zero) and a predetermined integer number Z, the phase number F corresponding to the phase angle phi divided by $2\pi$, multiplied by the number Z and rounded to an integer value;

a phase adapting circuit configured to generate an integer relative phase number P, and to count a number N of timing-pulses that occur between a first input pulse and a second input pulse; and an output trigger circuit configured to count a second number of timing-pulses that occur after the second input pulse until the second number corresponds to the relative phase number P and to generate an output pulse when the second number corresponds to the relative phase number P, wherein the integer relative phase number P corresponds to the number N multiplied by the phase number F, divided by the number Z and rounded to an integer value.

7. The apparatus according to claim 6, wherein the phase adapting circuit comprises an adder configured to add upon every timing-pulse the phase number F to a previous sum $S_{i-1}$.

8. The apparatus according to claim 7, wherein the adder is further configured to, every time a sum $S_i$ corresponds with Z, subtract Z from the sum $S_i$ and to generate an over-flow pulse, and wherein the phase adapting circuit includes an upward-counter configured to count a number of the over-flow pulses.

9. The apparatus according to claim 8, wherein the adder is defined as a binary adder having a width of b bits and is configured to generate the over-flow pulse when the sum $S_i$ exceeds b bits, the number Z being $Z=2^b$.

10. The apparatus according to claim 6, wherein the output trigger circuit comprises a downward-counter configured to, after an occurrence of the second input pulse, count down beginning with the relative phase number P and to generate the output pulse upon reaching 0 (zero).

\* \* \* \* \*